(12) United States Patent
Ohashi et al.

(10) Patent No.: US 9,666,509 B2
(45) Date of Patent: May 30, 2017

(54) SEMICONDUCTOR DEVICE

(71) Applicant: NEW JAPAN RADIO CO., LTD., Chuo-ku, Tokyo (JP)

(72) Inventors: Yuya Ohashi, Tokyo (JP); Jun Yamashita, Tokyo (JP); Yoshio Fujii, Tokyo (JP); Kohei Shirokura, Tokyo (JP)

(73) Assignee: New Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 14/988,450

(22) Filed: Jan. 5, 2016

(65) Prior Publication Data
US 2016/0211200 A1 Jul. 21, 2016

(30) Foreign Application Priority Data

Jan. 16, 2015 (JP) ................................. 2015-006359
Jul. 14, 2015 (JP) ................................. 2015-140326

(51) Int. Cl.
*H01L 23/49* (2006.01)
*H01L 23/495* (2006.01)
*H03K 19/00* (2006.01)
*H03K 19/003* (2006.01)
*H01L 23/31* (2006.01)
*H01L 23/522* (2006.01)

(52) U.S. Cl.
CPC .. *H01L 23/49517* (2013.01); *H01L 23/49551* (2013.01); *H01L 23/49558* (2013.01); *H01L 23/49575* (2013.01); *H03K 19/00* (2013.01); *H03K 19/00346* (2013.01); *H01L 23/3107* (2013.01); *H01L 23/5228* (2013.01); *H01L 2224/48091* (2013.01); *H01L 2224/48247* (2013.01); *H01L 2924/0002* (2013.01); *H01L 2924/181* (2013.01)

(58) Field of Classification Search
None
See application file for complete search history.

(56) References Cited

U.S. PATENT DOCUMENTS 5,327,009 A * 7/1994 Igeta ................... H01L 23/4951
257/666
5,521,431 A * 5/1996 Tahara .................. H01L 23/495
257/666

(Continued)

FOREIGN PATENT DOCUMENTS

JP 2009-201192 9/2009
JP 2012-095427 5/2012

*Primary Examiner* — Michael Lebentritt
(74) *Attorney, Agent, or Firm* — Procopio, Cory, Hargreaves & Savitch LLP

(57) ABSTRACT

One embodiment provides a semiconductor device having a first chip for lowering an input voltage and a second chip for performing signal processing, mounted on a die pad. Lead terminals are divided into a first lead row and a second lead row. The first lead row are connected with the first chip, the first chip are connected with the second chip or the second lead row, and the second chip are connected with the second lead row. A distance between the lead terminals of the first lead row is set longer than a distance between the lead terminals of the second lead row, and a sealing resin is provided to fill at least between the lead terminals of the first lead row.

11 Claims, 10 Drawing Sheets

(56) References Cited

U.S. PATENT DOCUMENTS

| | | | | |
|---|---|---|---|---|
| 5,877,548 | A * | 3/1999 | Washida | H01L 23/49541 257/666 |
| 7,173,333 | B2 * | 2/2007 | Hata | H01L 23/49562 257/183 |
| 2004/0130016 | A1 * | 7/2004 | Yamamoto | H01L 23/50 257/679 |
| 2007/0023877 | A1 * | 2/2007 | Yamazaki | H01L 23/49838 257/668 |
| 2008/0191328 | A1 * | 8/2008 | Kobayakawa | H01L 23/49503 257/676 |
| 2008/0211010 | A1 * | 9/2008 | Hata | H01L 23/49562 257/322 |
| 2011/0074016 | A1 * | 3/2011 | Narita | H01L 21/4821 257/737 |
| 2011/0093224 | A1 * | 4/2011 | Ide | G11C 29/02 702/64 |
| 2013/0341779 | A1 * | 12/2013 | Sakamoto | H01L 23/495 257/676 |
| 2014/0070365 | A1 * | 3/2014 | Viswanathan | H01L 23/49589 257/531 |
| 2014/0239359 | A1 * | 8/2014 | Seto | H01L 23/49562 257/288 |

\* cited by examiner

SEMICONDUCTOR DEVICE

CROSS-REFERENCE TO RELATED APPLICATION(S)

This application claims priorities from Japanese Patent Application No. 2015-006359 filed on Jan. 16, 2015, and from Japanese Patent Application No. 2015-140326 filed on Jul. 14, 2015, the entire contents of which are incorporated herein by reference.

FIELD

Embodiments described herein relate to a multi-chip semiconductor device and, more particularly, to a semiconductor device in which high voltages are applied to lead terminals.

BACKGROUND

In hybrid vehicles and electric vehicles, a vehicle drive battery is configured so as to output a prescribed drive voltage, and it is necessary to always monitor its output voltage. For example, a vehicle drive battery of a hybrid vehicle may produce an output voltage of about 200 V, and it may be boosted to about 500 V for use. In connection with this, a voltage monitoring circuit for watching for occurrence of an abnormal voltage is necessary. In recent years, a high-voltage monitoring circuit for watching for occurrence of an abnormal voltage that is higher than 1,000 V is demanded.

For example, JP-2009-201192-A and JP-2012-095427-A are related to an example motor drive device. FIG. 8 shows an example motor drive device 100. A high-voltage battery B is mounted on a vehicle body while being insulated therefrom. In the motor drive device 100, a boost converter 101 boosts a DC high voltage (e.g., 200 V) that is output from the battery B (to 600 V, for example), and an inverter circuit 103 converts the boost voltage into a 3-phase AC voltage for motor drive via a smoothing capacitor 102. The 3-phase AC voltage is supplied to a vehicle drive motor M.

To monitor the boost voltage, the motor drive device 100 is equipped with a voltage detection circuit 200. The voltage detection circuit 200 detects voltages at nodes b1 and b2 which are connected to the positive terminal and the negative terminal of the battery B, respectively. And, a control circuit (not shown) controls motor driving by outputting control signals the boost converter 101 and the inverter circuit 103 on the basis of detection results of the voltage detection circuit 200. As shown in FIG. 9, the voltage detection circuit 200 may be formed by an operational amplifier 201 and resistors 202a-202e.

As shown in FIG. 9, the series-connected resistors 202a and 202b divide a positive-side high voltage of the battery B. One terminal B1 is connected to the node b1 which is connected to the positive terminal of the battery B (see FIG. 8), and the other end is grounded to the vehicle body. The series connection point of the resistors 202a and 202b is connected to the non-inverting input terminal of the operational amplifier 201.

On the other hand, the series connected resistors 202c and 202d divide a negative-side high voltage of the battery B. One terminal B2 is connected to the node b2 which is connected to the negative terminal of the battery B (see FIG. 8), and the other end is grounded to the vehicle body. The series connection point of the resistors 202c and 202d is connected to the inverting input terminal of the operational amplifier 201.

The resistor (feedback resistor) 202e is provided to set an amplification gain of the operational amplifier 201. One end of the resistor 202e is connected to the inverting input terminal of the operational amplifier 201, and the other end is connected to an output terminal OUT of the operational amplifier 201. A detection signal that is output from the voltage detection circuit 200 is input to the control circuit (not shown), and the control circuit outputs control signals for controlling operations of the boost converter 101 and the inverter circuit 103, whereby driving of the motor M is controlled.

To manufacture a voltage detection circuit for detecting a high voltage to be used in a motor drive device of a hybrid vehicle or an electric vehicle, an integrated circuit chip consisting of an operational amplifier and resistors may be formed by a regular semiconductor device manufacturing process, and the integrated circuit chip may be mounted on a lead frame and sealed with resin. In this case, the resulting voltage detection circuit may not function if discharge occurs between high voltage application leads or between these leads and other, neighboring leads.

In view of this, it may be considered to employ a high-withstand-voltage structure as shown in FIG. 10 with a wide mounting area. Specifically, an operational amplifier integrated circuit 302 and plural chip resistors 303 are mounted on a mounting board 301, and are connected to each other by interconnections (not shown).

If a voltage that is higher than 600 to 1,000 V is applied to the voltage detection circuit, assuming that the resistance of each chip resistor 303 is 620 kΩ the number of resistors 303 to be mounted becomes as large as about 30 to 80. As each chip resistor 303 has a structure that a metal coating resistance element is formed on a ceramic substrate and measures about 2 mm×1 mm, the size of the mounting board may become a several centimeter square or a little larger than a 10 centimeter square. Thus, it is difficult to implement this structure in small size.

SUMMARY

One object of the present invention is to provide a semiconductor device to be used under a high voltage environment, such as a voltage detection circuit for a battery that supplies power to a vehicle drive motor. And, the present invention provides following Aspects 1-11.

1. A semiconductor device in which a first chip having a function of lowering an input voltage and a second chip having a function of performing signal processing on an output signal of the first chip are mounted on a die pad, wire connections are made between a part of chip electrodes of the first chip and the second chip and between an other part of the chip electrodes of the first chip and the second chip and external lead terminals, and a sealing resin is provided to seal,
   wherein the lead terminals constitute a first lead row and a second lead row which are opposite to each other with the die pad interposed in between, each of the first lead row and the second lead row having plural lead terminals,
   wherein the lead terminals of the first lead row are connected to a part of the chip electrodes of the first chip, an other part of the chip electrodes of the first chip are connected to a part of the chip electrodes of the second chip or a part of the lead terminals of the second lead row, and an other part of the chip electrodes of the second chip are connected to an other part of the lead terminals of the second lead row, wherein a distance between the lead terminals of the first lead row is set longer than a distance between the lead terminals of the second lead row to thereby allow the lead terminals of the first lead row withstand a higher applied voltage than the lead terminals of the second lead row, and wherein the sealing resin fills at least between the lead terminals of the first lead row.

2. A semiconductor device in which a first chip having a function of lowering an input voltage and a second chip having a function of performing signal processing on an output signal of the first chip are mounted on a die pad, wire connections are made between a part of chip electrodes of the first chip and the second chip and between an other part of the chip electrodes of the first chip and the second chip and external lead terminals, and a sealing resin is provided to seal, wherein the lead terminals constitute a first lead row and a second lead row which are opposite to each other with the die pad interposed in between, each of the first lead row and the second lead row having plural lead terminals, wherein the first chip has resistors as main constituent elements, wherein the second chip has an operational amplifier as a main constituent element, wherein the lead terminals of the first lead row are two lead terminals which are connected to two respective resistor chip electrodes formed along one side of the rectangular-shaped first chip facing the first lead row, wherein other resistor chip electrodes formed along an other side of the first chip opposite to the first lead row are connected to a part of operational amplifier chip electrodes formed along one side of the rectangular-shaped second chip facing the first lead row or a part of the lead terminals of the second lead row, wherein an other part of the operational amplifier chip electrodes of the second chip are connected to an other part of the lead terminals of the second lead row, wherein voltages applied to the two lead terminals of the first lead row are divided by resistors formed in the first chip, and resulting divided voltages are input to an inverting input terminal and a non-inverting input terminal of the operational amplifier formed in the second chip, and wherein an output signal that is produced by the second chip is externally output from one of the lead terminals of the second lead row, wherein the two lead terminals of the first lead row are spaced from each other by a distance adjusted to allow the two lead terminals to withstand the voltages applied thereto, and wherein the sealing resin fills at least between the two lead terminals of the first lead row.

3. A semiconductor device in which a first chip having a function of lowering an input voltage and a second chip having a function of performing signal processing on an output signal of the first chip are mounted on a die pad, wire connections are made between a part of chip electrodes of the first chip and the second chip and between an other part of the chip electrodes of the first chip and the second chip and external lead terminals, and a sealing resin is provided to seal, wherein the lead terminals constitute a first lead row and a second lead row which are opposite to each other with the die pad interposed in between, each of the first lead row and the second lead row having plural lead terminals, wherein the first chip has resistors as main constituent elements, the resistors including a first voltage-dividing resistor series, a second voltage-dividing resistor series and a feedback resistor.

wherein the second chip has an operational amplifier as a main constituent element, wherein the lead terminals of the first lead row are two lead terminals which are connected to two respective resistor chip electrodes formed along one side of the rectangular-shaped first chip facing the first lead row, one of the two resistor chip electrodes being connected to the first voltage-dividing resistor series for dividing a voltage applied thereto, an other one of the two resistor chip electrodes being connected to the second voltage-dividing resistor series for dividing a voltage applied thereto, wherein other resistor chip electrodes formed along an other side of the first chip opposite to the first lead row are connected to a part of operational amplifier chip electrodes formed along one side of the rectangular-shaped second chip facing the first lead row or a part of the lead terminals of the second lead row, the other resistor chip electrodes including a first series connection point for outputting a first divisional voltage from the first voltage-dividing resistor series and a second series connection point for outputting a second divisional voltage from the second voltage-dividing resistor series, the first series connection point and the second series connection point being connected to an inverting input terminal and a non-inverting input terminal of the part of the operational amplifier chip electrodes, wherein the feedback resistor is connected between an output terminal of the part of the operational amplifier chip electrodes and the inverting input terminal of the part of the operational amplifier chip electrodes, wherein an other part of the operational amplifier chip electrode is connected to an other part of the lead terminals of the second lead row, wherein voltages applied to the two lead terminals of the first lead row are divided by the first voltage-dividing resistor series and the second voltage-dividing resistor series, and resulting divided voltages are input to the inverting input terminal and the non-inverting input terminal of the operational amplifier formed in the second chip, wherein an output signal that is produced by the second chip is externally output from one of the lead terminals of the second lead row, wherein the two lead terminals of the first lead row are spaced from each other by a distance adjusted to allow the two lead terminals to withstand the voltages applied thereto, and wherein the sealing resin fills at least between the two lead terminals of the first lead row.

4. The semiconductor device of Aspect 1, wherein auxiliary interconnections are formed on a surface portion of the first chip at the other side thereof facing the second lead row, and wherein the other chip electrode of the second chip is connected to the other lead terminal of the second lead row via the auxiliary interconnections.

5. The semiconductor device of Aspect 2 or 3, wherein auxiliary interconnections are formed on a surface portion of the first chip at the other side thereof facing the second lead row, and wherein an other part of the operational amplifier chip electrodes and the output terminal of the operational amplifier are connected to the lead terminals of the second lead row via the auxiliary interconnections.

6. The semiconductor device of Aspect 1,
wherein one lead terminal of the second lead row is connected to one chip electrode of the first chip or one chip electrode of the second chip via a relay chip that is mounted on the die pad.

7. The semiconductor device of Aspect 2 or 3,
wherein one lead terminal of the second lead row is connected to one resistance chip electrode of the first chip or one operational amplifier chip electrode of the second chip via a relay chip that is mounted on the die pad.

8. The semiconductor device of any one of Aspects 1 to 3,
wherein suspension leads are further provided to the second lead row.

9. The semiconductor device of any one of Aspects 1 to 3,
wherein the sealing resin further covers a back surface of the die pad.

10. The semiconductor device of any one of Aspects 1 to 3,
wherein one lead terminal of the second lead row is connected to one chip electrode of the first chip and the second chip, one resistor chip electrode of the first chip, or one operational amplifier chip electrode of the second chip via a relay chip that is mounted on the die pad, the relay chip including an ESD protection element.

11. The semiconductor device of Aspects 2 or 3,
wherein the second chip further includes an additional operational amplifier in addition to the operational amplifier, and
wherein operational amplifier electrodes of the additional operational amplifier are arranged along an other side of the second chip facing the second lead row, and alongside a second-lead-row-side edge of the second chip and connected to the other part of the lead terminals of the second lead row.

In the above-mentioned semiconductor device, even in the case where high voltages that are higher than 1,000 V are applied to the first lead row, the voltage lowering function of the first chip prevents destruction of the first chip or a second chip which mainly performs signal processing and discharge between the lead terminals of the first lead row or between the lead terminals of the first lead row and the lead terminals of the second lead row. Thus, the semiconductor device can be used under a high-voltage application condition.

In particular, since the lead terminals and the die pad suspension leads are formed only to constitute the first lead row and the second lead row, each of the lead terminals of the first lead row is disposed at such a position as to be sufficiently spaced from the other (suspension) lead terminals. This makes it possible to apply high voltages to the lead terminals of the first lead row. Forming sealing resin between the lead terminals is very effective in preventing occurrence of discharge.

Since the back surface of the die pad is covered with sealing resin provides an advantage that occurrence of discharge between the die pad and the lead terminals.

The above-mentioned semiconductor device can be made much smaller than conventional semiconductor devices having a configuration that plural chip resistors are mounted on a mounting board. In particular, the above-mentioned semiconductor device has the high voltage detecting function which is required of voltage detection circuits for vehicle drive batteries, and hence are very effective in miniaturizing vehicular components.

In the above-mentioned semiconductor device, the two chips are mounted on the die pad, and each chip is connected to leads of one of the lead rows. Wire-connecting a chip electrode to a lead terminal via an auxiliary interconnection makes it possible to secure necessary wire-to-wire distances. This prevents such problems as deformation of a wire due to contact of a wire bonding jig during wire bonding and contact between wires due to pressure of sealing resin that is injected at the time of resin sealing.

In the above-mentioned semiconductor device, the two chips are mounted on the die pad, and each chip is connected to leads of one of the lead rows. Wire-connecting a chip electrode to a lead terminal via relay chip also makes it possible to secure necessary wire-to-wire distances. This prevents such problems as deformation of a wire due to contact of a wire bonding jig during wire bonding and contact between wires due to pressure of sealing resin that is injected at the time of resin sealing.

The configuration in which a relay chip is additionally formed with an ESD protection element provides an advantage that the electrodes that are connected to the relay chip are prevented effectively from electrostatic breakdown.

Where the second chip is an operational amplifier chip, a double-operational-amplifier circuit that is marketed broadly can be employed as it is. A semiconductor device having desired characteristics can be designed by switching to an operational amplifier circuit according to a specification required, which means an advantage that the degree of freedom of designing is thus increased. For example, an operational amplifier that is not used as part of the voltage detection circuit can be used as a circuit for processing an output signal of the voltage detection circuit, which means an advantage that the device as a whole including the voltage detection circuit can be miniaturized.

DETAILED DESCRIPTION

Embodiments provide a semiconductor device to which high voltages (e.g., about 1,000 V) can be applied. The semiconductor device according to the embodiments generally has a divisional, multichip structure consisting of a first chip for lowering a high-voltage signal received directly and a second chip for performing signal processing on a reduced voltage signal that is supplied from the first chip.

Lead terminals to which high voltages are applied directly are spaced from the other lead terminals and die pad suspension leads so that no discharge occurs between the lead terminals and the suspension leads. The arrangement of chip electrodes to which the lead terminals are connected is optimized and, if necessary, wire connections are made via an auxiliary interconnection(s) and/or a relay chip(s).

Sealing resin is formed between at least lead terminals to which high voltages are applied, to prevent occurrence of discharge between them. If necessary, resin sealing is performed so that the back surface of a die pad is covered with the sealing resin, to prevent occurrence of discharge there. Embodiments will be described below in detail.

Embodiment 1

Figure 1:
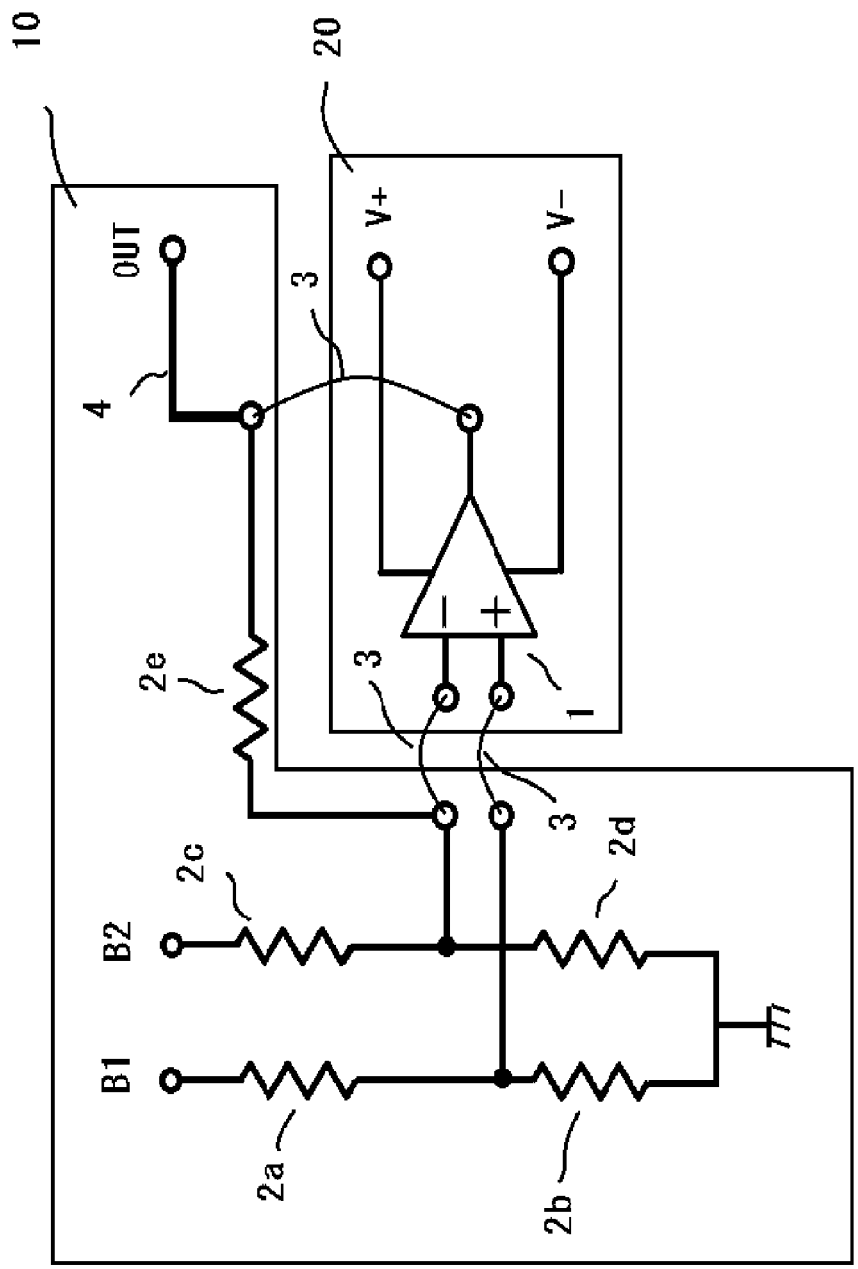
FIG. 1 is a block diagram of a voltage detection circuit according to a first embodiment.
Figure 9:
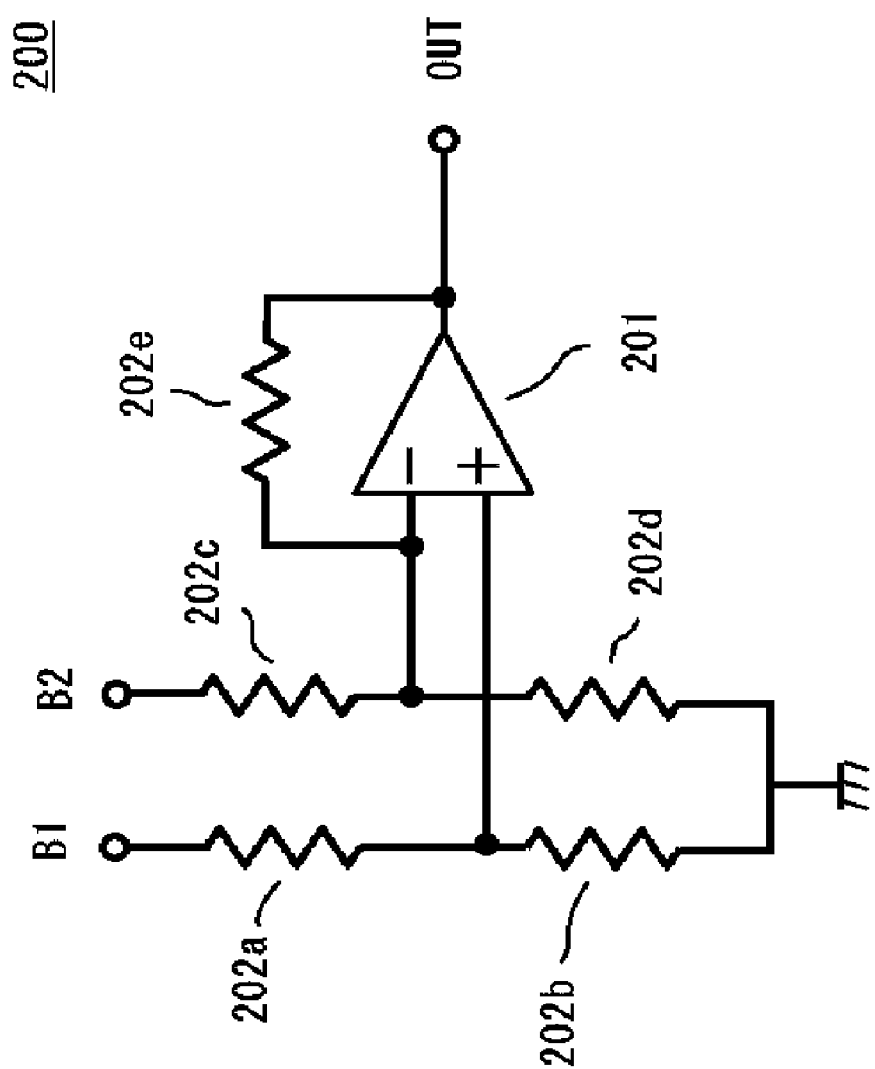
FIG. 9 shows an example voltage detection circuit.
Figure 10:
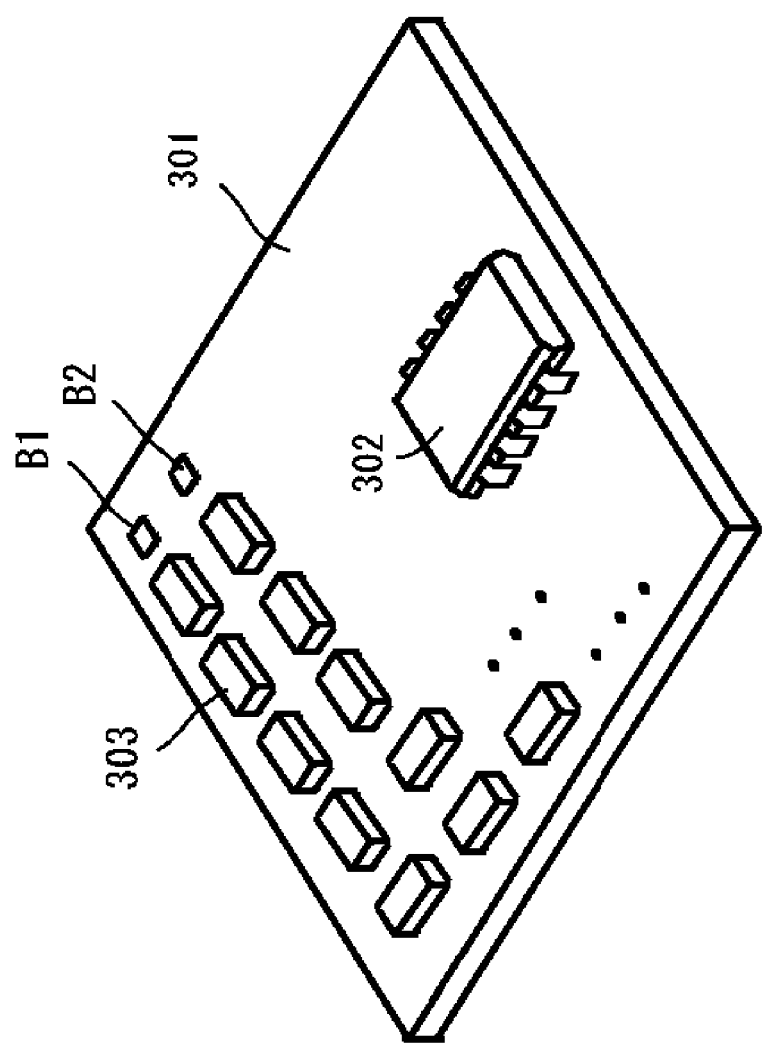
FIG. 10 shows an example voltage detection circuit in a state of being mounted on a mounting board.

FIG. 1 is a block diagram of a voltage detection circuit according to a first embodiment, which is to detect high voltages that are higher than 1,000 V. As shown in FIG. 1, the circuit configuration itself of this voltage detection circuit is not very different from that of the conventional voltage detection circuit shown in FIG. 9.

Figure 8:
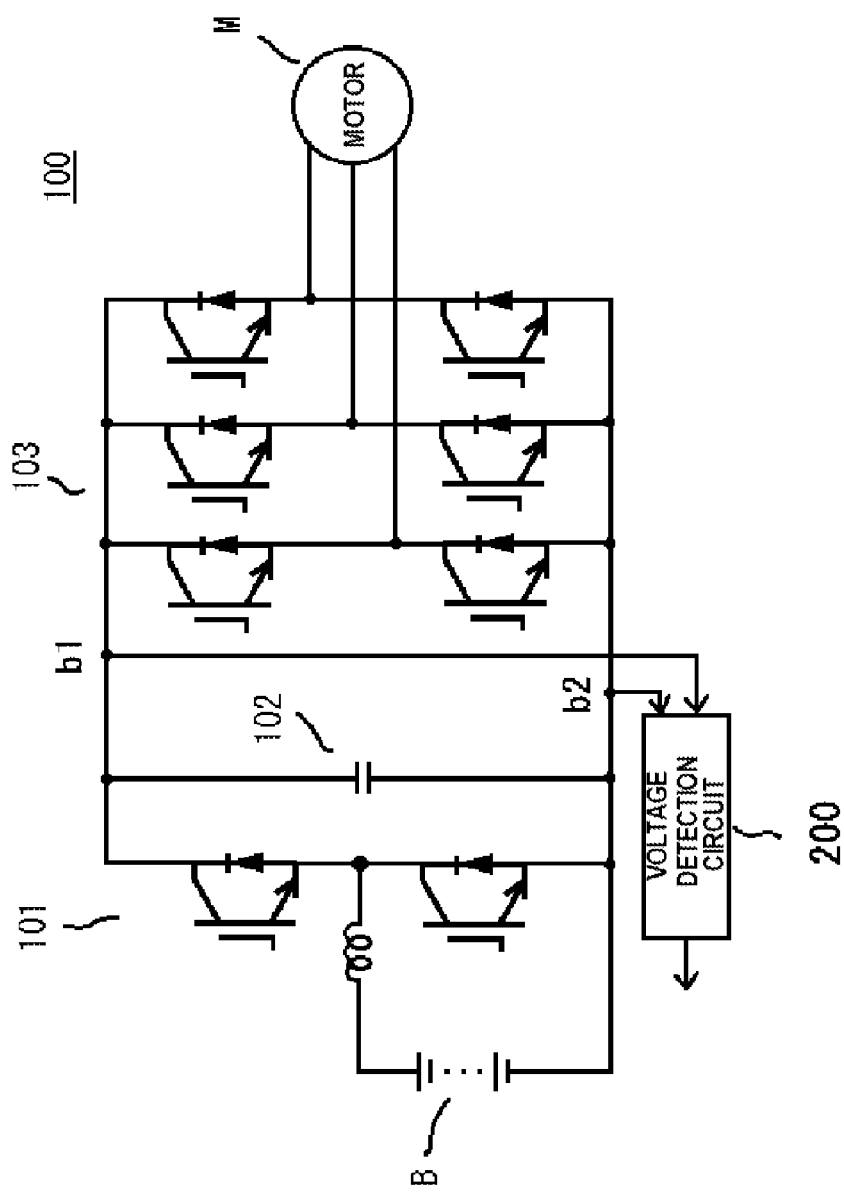
FIG. 8 shows an example motor drive circuit.

Resistors $2a$ and $2b$ are connected to each other in series to thereby divide a positive-side high voltage of the battery B. One terminal B1 is connected to the node b1 which is connected to the positive terminal of the battery B (see FIG. 8) and the other end is grounded to the vehicle body. The series connection point of the resistors $2a$ and $2b$ is connected to the non-inverting input terminal of an operational amplifier 1. In this embodiment, since a first chip 10 in which resistors are formed and a second chip 20 in which the operational amplifier 1 is formed are separate chips, the series connection point of the resistors $2a$ and $2b$ is connected to the non-inverting input terminal of an operational amplifier 1 by a wire 3.

On the other hand, resistors $2c$ and $2d$ are connected to each other in series to thereby divide a negative-side high voltage of the battery B. One terminal B2 is connected to the node b2 which is connected to the negative terminal of the battery B and the other end is grounded to the vehicle body. The series connection point of the resistors $2c$ and $2d$ is connected to the inverting input terminal of the operational amplifier 1 by a wire 3.

A resistor (feedback resistor) $2e$ is provided to set an amplification gain of the operational amplifier 1. One end of the resistor $2e$ is connected to the inverting input terminal of the operational amplifier 1 and the other end is connected to an output terminal OUT of the operational amplifier 1 by a wire 3. The output terminal OUT of the operational amplifier 1 is connected to a control circuit (not shown), which outputs control signals for controlling operations of the boost converter 101 and the inverter circuit 103 shown in FIG. 8, whereby driving of the motor M is controlled.

The first chip 10 used in the embodiment which is equipped with the resistors consists of resistance elements (what is called thin-film resistance elements) that can be manufactured by a regular semiconductor device manufacturing process. For example, where the resistors $2a$-$2e$ have resistance values 12 MΩ, 14 kΩ, 12 MΩ, 18 kΩ, and 60 kΩ, respectively, the first chip 10 In the can be manufactured so as to measure 3.0 mm×1.5 mm.

In the voltage detection circuit of FIG. 1, an output signal is output via an auxiliary interconnection 4 which is formed in the first chip 10. As described later in detail, the use of the auxiliary interconnection 4 is advantageous in making a wire connection in the case where the voltage detection circuit is implemented on a lead frame.

Figure 2:
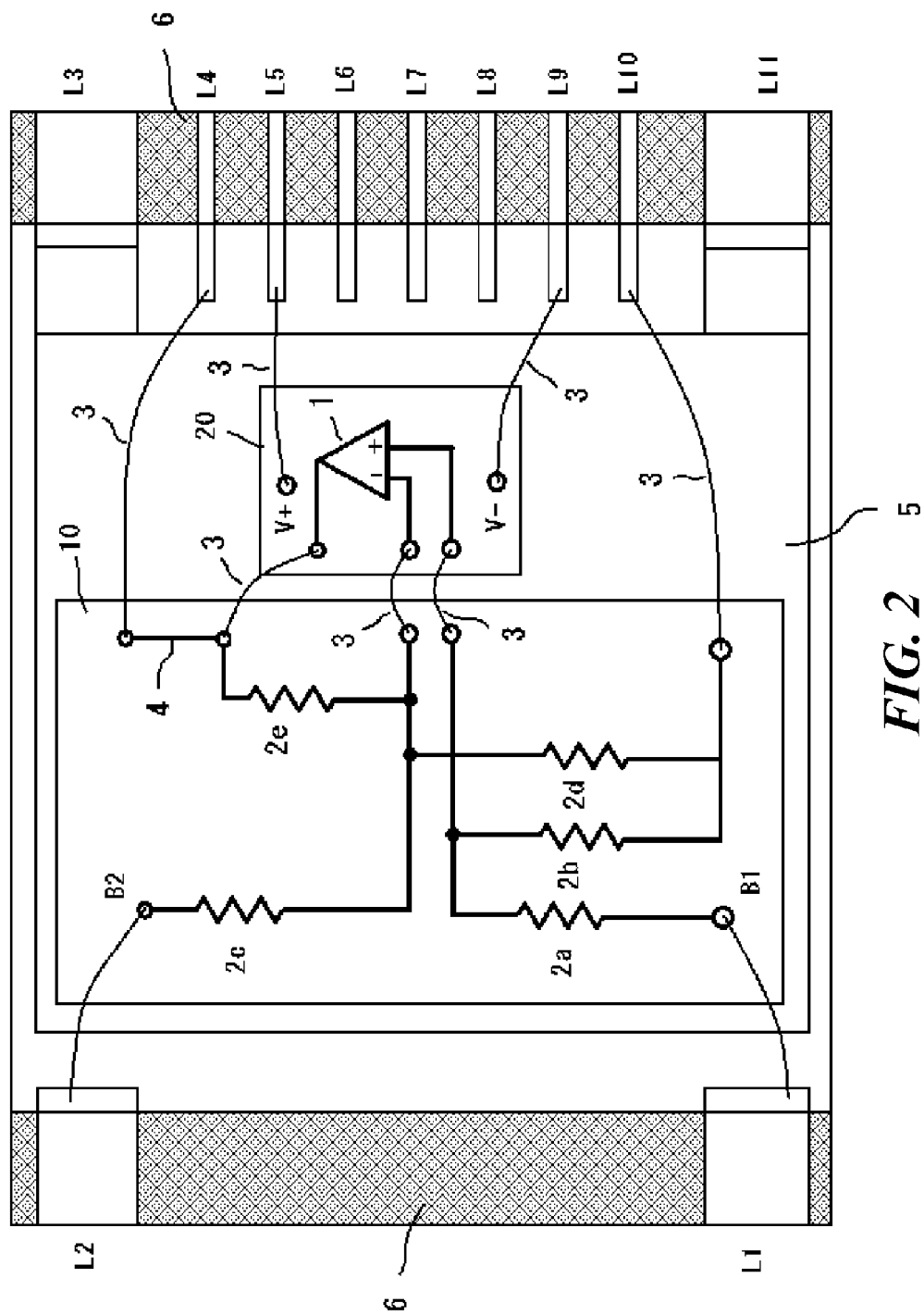
FIG. 2 shows specific connections of the voltage detection circuit according to the first embodiment in a state of being implemented on a lead frame.

FIG. 2 schematically shows specific connections of the voltage detection circuit of FIG. 1. The voltage detection circuit is configured by implementing the first chip 10 in which resistors are formed and the second chip 20 in which the operational amplifier 1 on a lead frame.

As shown in FIG. 2, the first chip 10 in which resistors are formed and the second chip 20 in which the operational amplifier 1 is formed are mounted on a die pad 5. The lead frame has two lead terminals L1 and L2 (which correspond to a first lead row) on the left side in FIG. 2 and also has seven lead terminals L4-L10 and two suspension leads L3 and L11 for the die pad 5 (which correspond to part of a second lead row) on the right side.

The lead terminal L1 to which the terminal B1 is connected is connected to the node b1 which is connected to the positive terminal of the battery B, and the lead terminal L2 to which the terminal B2 is connected is connected to the node b2 which is connected to the negative terminal of the battery B. The other end of the series connection of the resistors $2a$ and $2b$ is connected to a ground potential body, more specifically, the vehicle frame, via the lead terminal L10. The connection point of the resistors $2a$ and $2b$ is connected, by the wire 3, to the non-inverting input terminal of the operational amplifier 1 which is formed in the second chip 20. Likewise, the other end of the series connection of the resistors $2c$ and $2d$ is connected to the ground potential body, more specifically, the vehicle frame, via the lead terminal L10. The connection point of the resistors $2c$ and $2d$ is connected to the inverting input terminal of the operational amplifier 1 by the wire 3.

The output terminal of the operational amplifier 1 which is formed in the second chip 20 is connected, by the wire 3, to one end of the resistor $2e$ which is formed in the first chip 10. The other end of the resistor $2e$ is connected to the connection point of the resistors $2c$ and $2d$ and hence is connected, by the wire 3, to the inverting input terminal of the operational amplifier 1 which is formed in the second chip 20, whereby the resistor $2e$ serves as a feedback resistor for the operational amplifier 1.

Power terminals of the operational amplifier 1 are formed in the second chip 20. Voltage source terminals V+ and V− are connected to and supplied with power source voltages from the lead terminals L5 and L9, respectively.

It is also possible to directly connect the output terminal of the operational amplifier 1 to the output lead terminal L4 by a wire 3. However, in the embodiment, to avoid contact to and the wire 3 that connects the voltage source terminal V+ of the operational amplifier 1 to the lead terminal L5, the output terminal of the operational amplifier 1 is connected to the lead terminal L4 via the wire 3 and the auxiliary interconnection 4 which is formed in the first chip 10.

In the embodiment, to secure a necessary creepage distance between the lead terminals L1 and L2, the lead terminals are disposed so as to be separated from each other by prescribed distances according to voltages to be applied to them. Since voltages to be applied to the first lead row are higher than voltages to be applied to the second lead row, the interval between the lead terminals L1 and L2 of the first lead row is longer than the intervals between the lead terminals of the second lead row.

The lead terminal L1 not only has the necessary creepage distance from the lead terminal L2 but also is disposed at such a position as to be spaced from the other lead terminals L4-L10 by prescribed distances. The lead terminal L2 is also disposed at such a position as to be spaced from the other lead terminals L4-L10 by prescribed distances. Likewise, to secure necessary creepage distances, the suspension leads L3 and L11 for the die pad 5 are disposed on the right side in FIG. 2 (i.e., as part of the second lead row).

Figure 3:
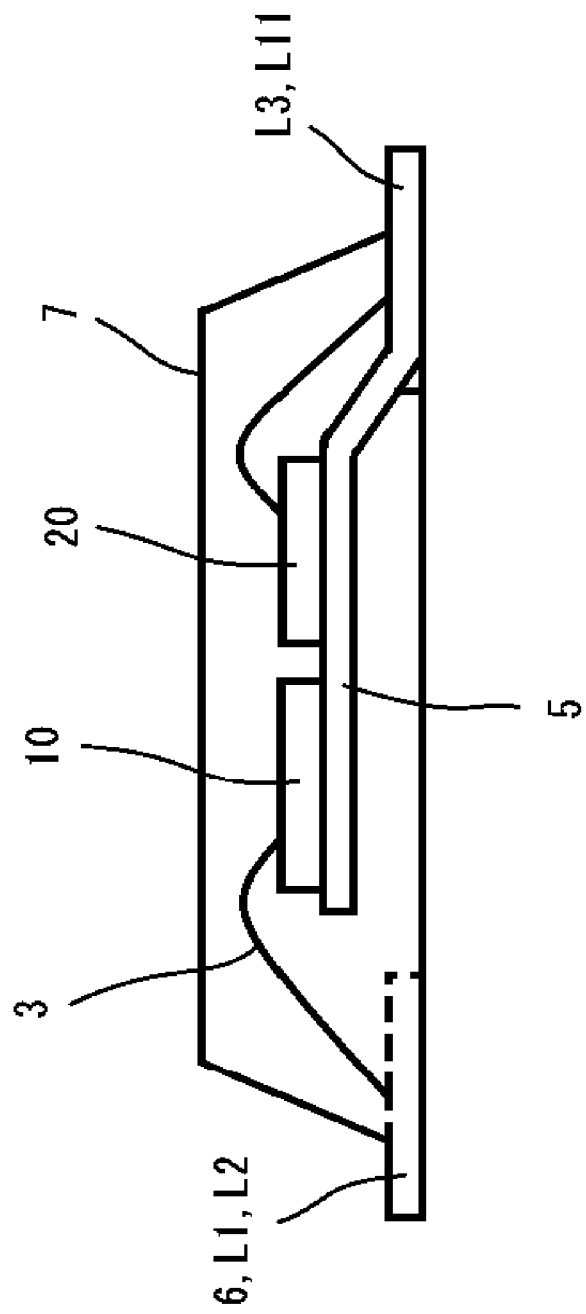
FIG. 3 shows a sectional structure of a semiconductor device according to the first embodiment so as to receive even higher voltage.

To prevent occurrence of discharge between the lead terminals L1 and L2 which are exposed outside from a semiconductor device body as sealed with sealing resin, in the embodiment resin layers 6 are formed between the lead terminals at a thickness corresponding to the thickness of the lead terminals. As shown in FIG. 2, the resin layers 6 are formed between those portions of the lead terminals which are exposed from a sealed semiconductor device body in which the first chip 10, the second chip 20, the wires 3, etc. are sealed in with sealing resin. Since the resin layers 6 are formed at the same time as a resin-sealed semiconductor device body, as shown in FIG. 2 part of the resin layers 6 are formed between the lead terminals of the second lead row.

Where even higher voltages are applied, it may be preferable that resin sealing be performed so that the die pad 5 is not exposed from the semiconductor device body. FIG. 3 schematically shows a sectional structure of a semiconductor device that is suitable for the case of receiving even higher voltages. As shown in FIG. 3, the die pad 5 can easily be sealed in a semiconductor device body 7 by forming the die pad 5 so that its back surface does not project from a sealing resin and forming the suspension leads L3 and L11 so that they are placed inside the sealing resin.

As described above, in the semiconductor device according to the embodiment, the lead terminals L1 and L2 which are connected to the first chip 10 to which high voltages are applied are disposed at positions opposite to the other lead terminals, so as to have a creepage distance that is suitable for the voltages applied to them. And, the resin layers 6 are formed between the lead terminals. Thus, the structure capable withstand the high voltages can be obtained. A semiconductor device capable of withstanding even high voltages can be realized by a structure in which the back surface of the die pad 5 is not exposed.

In FIG. 2, the lead terminals L6-L8 are not connected to any circuit elements. The lead terminals L6-L8 may be used to realize connections in which the auxiliary interconnection 4 is not used. Even a lead frame structure not having the lead terminals L6-L8 suffers no problems.

Embodiment 2

Figure 4:
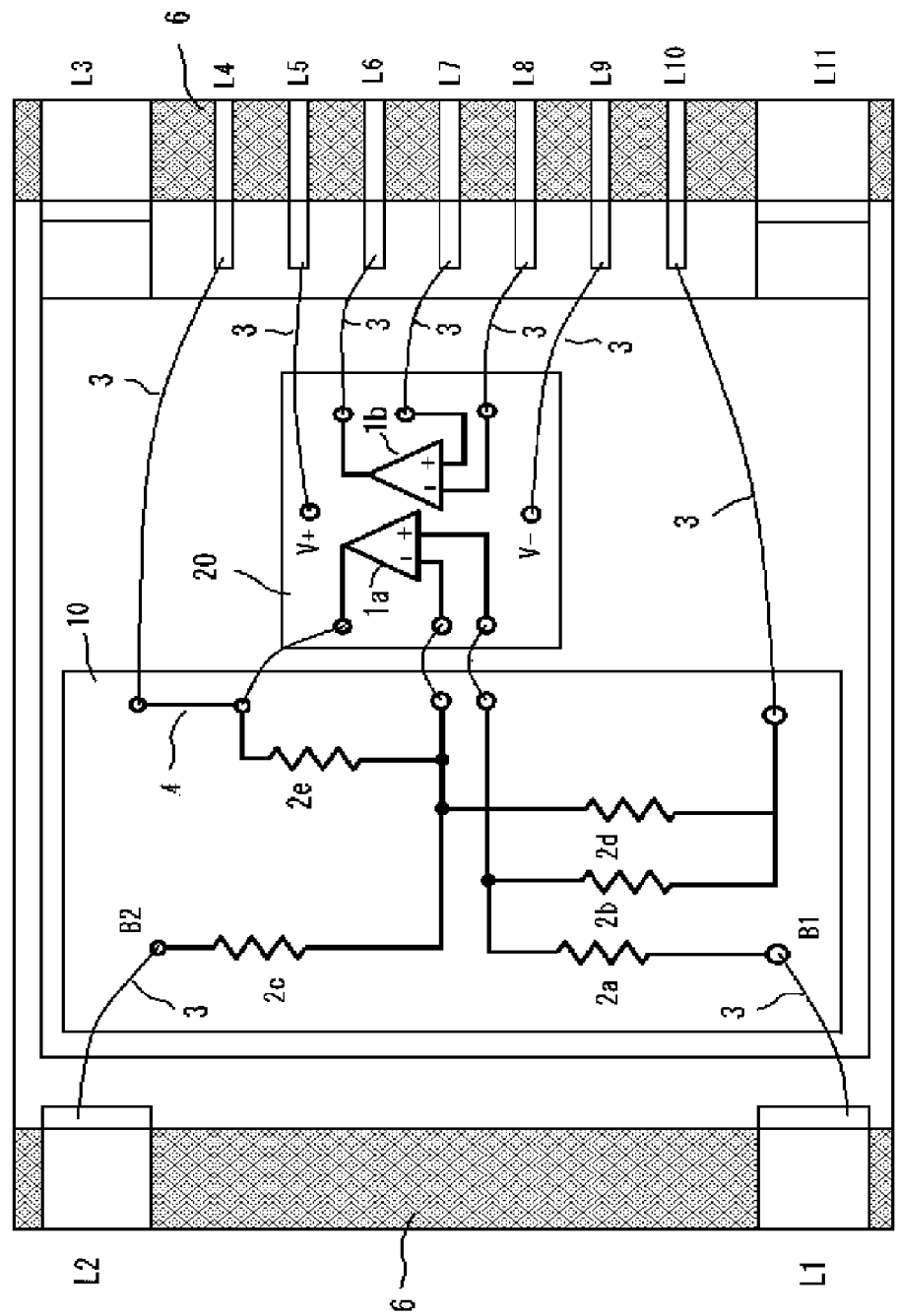
FIG. 4 shows specific connections of a voltage detection circuit according to a second embodiment in a state of being implemented on a lead frame.

Next, a semiconductor device according to a second embodiment will be described which is different from the semiconductor device according to the first embodiment in the structure of the second chip 20. In this embodiment, a double-operational-amplifier circuit (operational amplifiers 1a and 1b) is formed in the second chip 20. Such double-operational-amplifier circuits are marketed broadly as general-purpose semiconductor devices and exhibit characteristics that are unique to respective suppliers. On the other hand, as the fact that they are called pin-compatible devices implies, when they are mounted on lead frames, lead frame that are exposed to the outside have functions common to suppliers. As shown in FIG. 4, the chip electrodes of the semiconductor chip incorporated inside are such that the electrodes of the operational amplifiers lead out on one side.

Where such a double-operational-amplifier circuit is used as the second chip 20, the operational amplifier 1a can be connected in the manner described in the first embodiment. As for the operational amplifier 1b, its non-inverting input terminal, inverting input terminal, and output terminal can be connected to terminals L7, L8, and L6 by wires 3, respectively.

The thus-formed voltage detection circuit enables that an output signal that is output from the lead terminal L4 is subjected to necessary processing outside and a resulting signal is input to the operational amplifier 1b and processed therein. For example, it is possible to perform impedance conversion using the operational amplifier 1b as a buffer circuit and then input an output signal of the operational amplifier 1b to a control circuit or to use the operational amplifier lb as a filter to eliminate high-frequency noise.

Configurations using the operational amplifiers 1a and 1b are prone to suffer various problems because of a large number of wires 3 for internal connections. In contrast, in the embodiment, proper distances can be secured by forming connections via the auxiliary interconnection 4 to prevent such problems as deformation of a wire 3 due to contact of a wire bonding jig during wire bonding and contact between wires 3 due to pressure of sealing resin that is injected at the time of resin sealing.

Embodiment 3

Next, a third embodiment will be described. In the above-described first and second embodiments, chip electrodes of the first chip 10 are directly connected to lead terminals of the second lead row by wires 3. However, where these wires 3 are long, trouble may occur, for example, pressure acting on a wire 3 at the time of resin sealing causes it to touch another wire 3. In view of this, in this embodiment, as shown in FIG. 5, chip electrodes of the first chip 10 are connected to the lead terminals L4 and L10 of the second lead row via respective relay chips 30.

Figure 5:
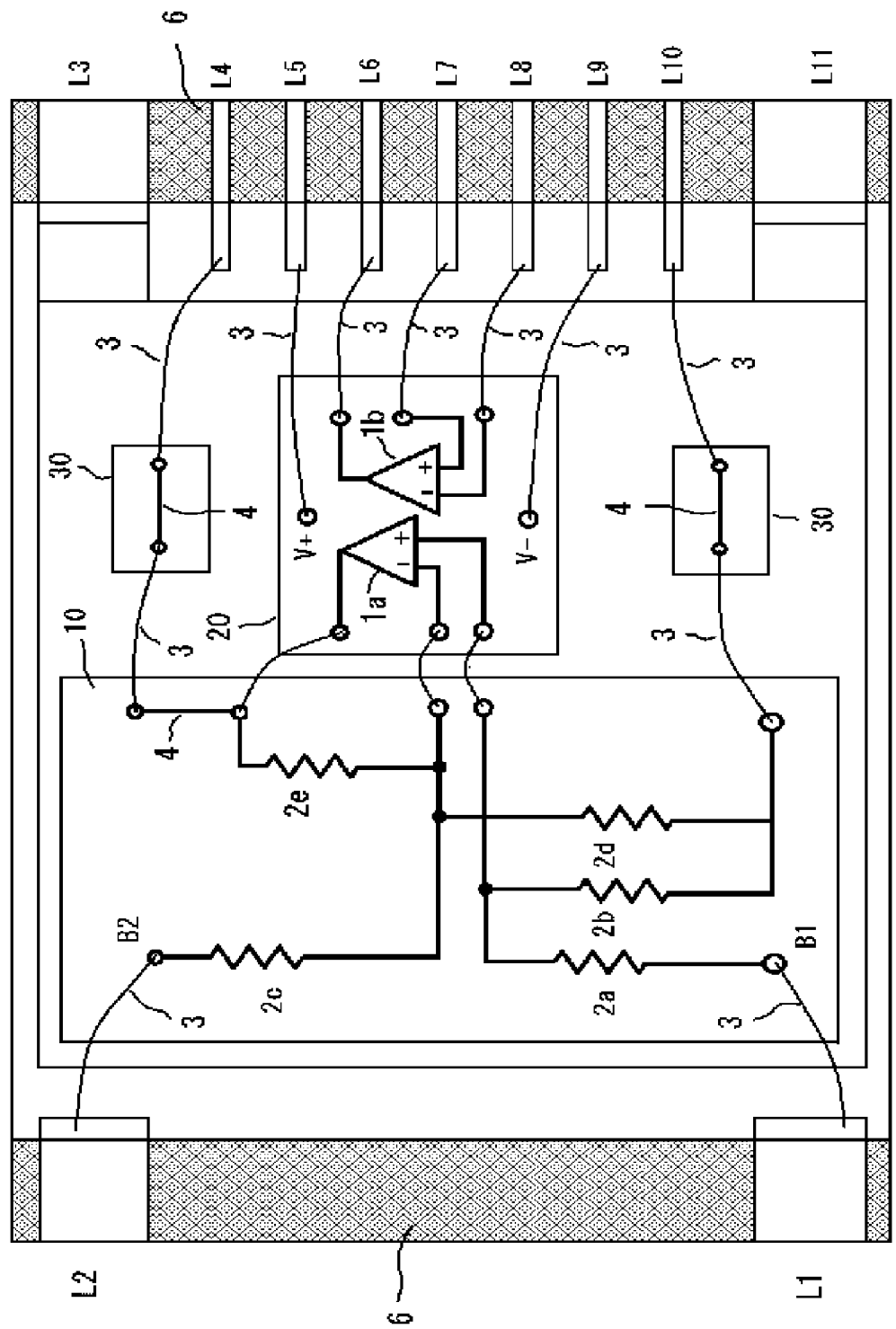
FIG. 5 shows specific connections of a voltage detection circuit according to a third embodiment in a state of being implemented on a lead frame.

As shown in FIG. 5, each relay chip 30 may have a structure having an auxiliary interconnection 4 which is formed in the same manner as the auxiliary interconnection 4 is formed in the first chip 10. The auxiliary interconnection 4 are formed on the surface of the relay chip 30 and connection chip electrodes are formed on the same surface at the two respective ends of the auxiliary interconnection 4. The use of the auxiliary interconnection 4 provides an advantage that the related wires 3 are made shorter and the connecting point of the wire 3 that is connected to the first chip 10 and the connecting point of the wire 3 that is connected to the lead terminal L4 or L10 can be set as desired. By appropriately adjusting the mounting position of each relay chip 30, occurrence of trouble can be prevented such as deformation of a wire 3 due to contact of a wire bonding jig during wire bonding or contact between wires 3 due to pressure of sealing resin that is injected at the time of resin sealing.

The shape of each relay chip 30 is not limited to the above-described one; each relay chip 30 may be formed with only electrodes. Where plural relay chips 30 are used as in the case of FIG. 5, they may have different shapes. Part of the connections from the first chip 10 to the lead terminals of the second lead row may be a direct wire connection.

Although the configuration of FIG. 5 is such that the relay chips 30 are added to the configuration of the second embodiment (see FIG. 4), the relay chips 30 may be added to the configuration of the first embodiment (see FIG. 2).

Embodiment 4

Figure 6:
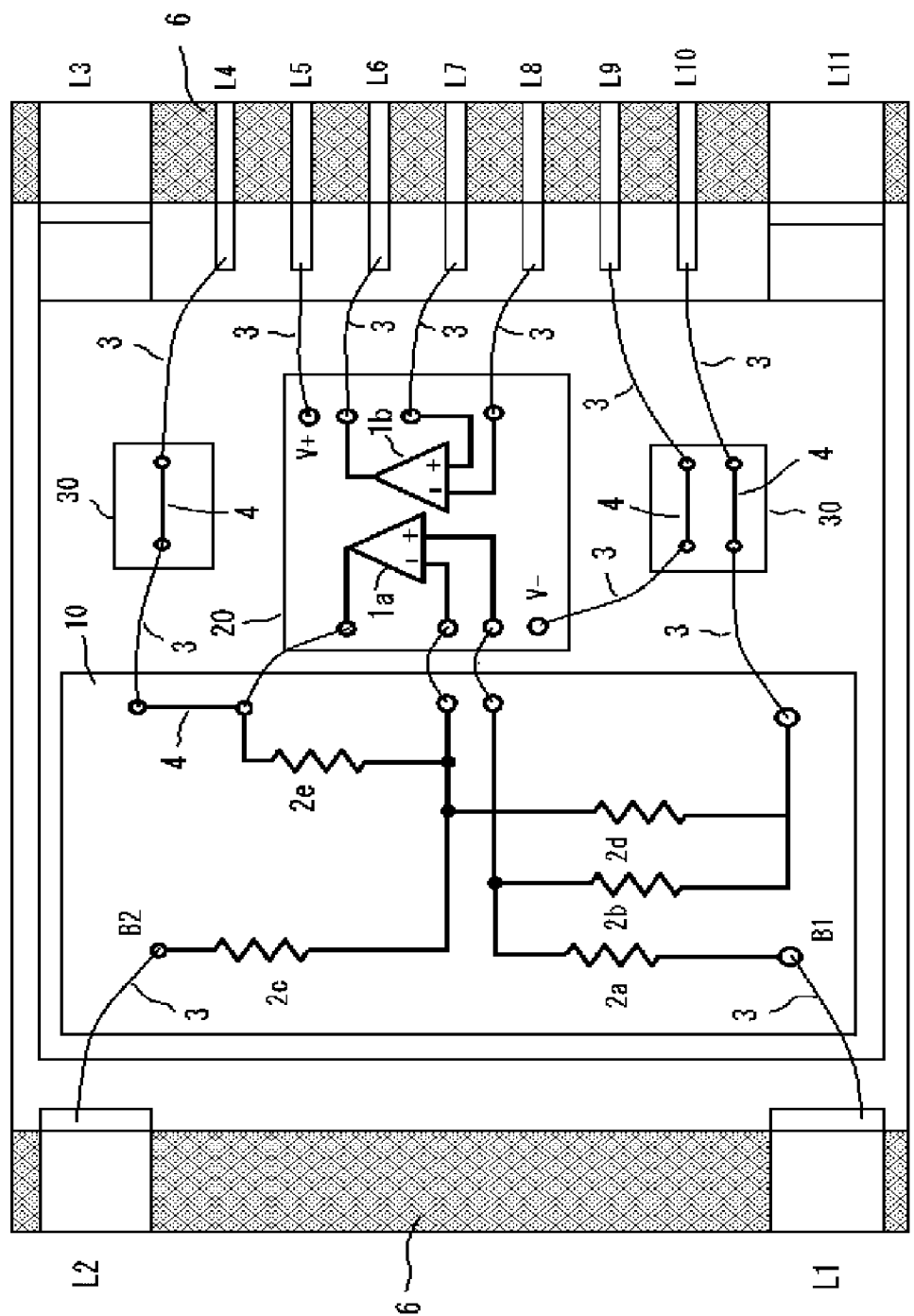
FIG. 6 shows specific connections of a voltage detection circuit according to a fourth embodiment in a state of being implemented on a lead frame.

Next, a fourth embodiment will be described. It is not always the case that the relay chips 30 are used for connections between the first chip 10 and lead terminals of the second lead row. For example, as shown in FIG. 6, in addition to the connections between the first chip 10 and lead terminals L4, L10 of the second lead row, the relay chips 30 may be used for a connection between the second chip 20 and a lead terminal of the second lead row. FIG. 6 shows a configuration that is different from the configurations of the first to third embodiments in the locations of the power source terminals V+ and V− in the second chip 20; the power source terminal V− of the second chip 20 is connected to the lead terminal L9 via one of the relay terminals 30.

As in the third embodiment, the shape of each relay chip 30 is not limited to the above-described one; an additional relay chip 30 may be used instead of forming plural auxiliary interconnections 4 on one relay chip 30 (see FIG. 6). For other examples, the positions of the relay chips 30 may be set as appropriate and connections using the relay chips 30 and connections not using any relay chips 30 may be employed in mixture as appropriate. As such, this embodiment provides the same advantages as the third embodiment. Also in this embodiment, the relay chips 30 may be added to the configuration of the first embodiment (see FIG. 2).

Embodiment 5

Next, a fifth embodiment will be described. In the semiconductor devices according to the embodiments, the internal circuit may be destroyed when receiving a surge voltage such as one caused by static electricity. It may be therefore preferable to further include an ESD protection element.

An ESD protection element can easily be formed in the second chip 20 at the same time as the operational amplifier circuit is. However, in the first chip 10 to which high voltages are to be applied, a high degree of insulation needs to be secured around interconnections and a thicker insulating film is formed than in ordinary semiconductor devices. Whereas in ordinary semiconductor devices a surface oxide film is about 0.7 μm in thickness, in the first chip 10, to which high voltages (>1,000 V) are applied, of the semiconductor device according to the embodiment it is necessary to form an oxide film that is thicker than 5 μm. Therefore, where an ESD protection element is formed on a semiconductor substrate located under the oxide film, a portion of the thick oxide film needs to be removed to make a connection to the ESD protection element.

Figure 7:
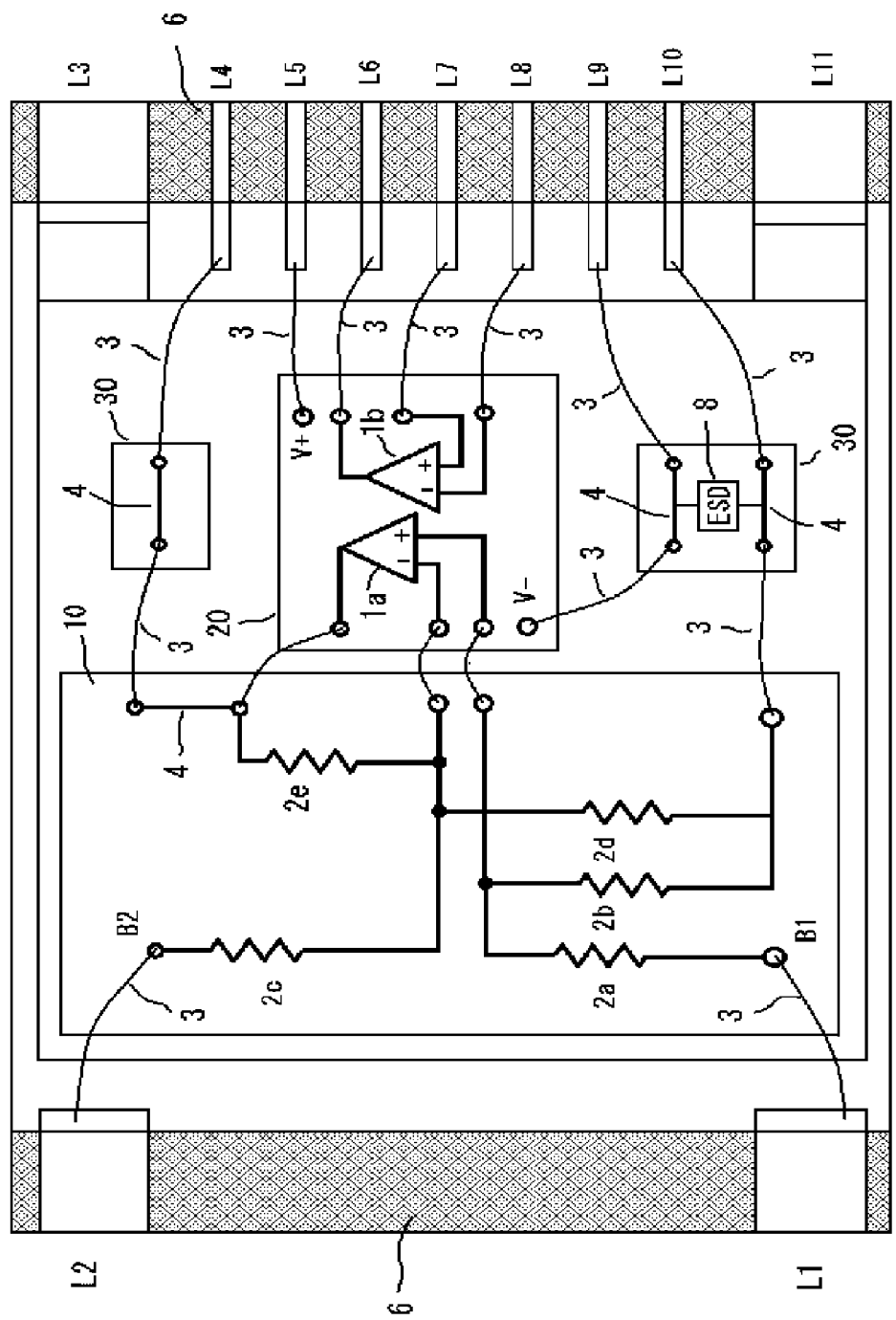
FIG. 7 shows specific connections of a voltage detection circuit according to a fifth embodiment in a state of being implemented on a lead frame.

In view of the above, in the embodiment, as shown in FIG. 7, an ESD protection element 8 is formed in a relay chip 30. It is not necessary to form a thick surface insulating film in the relay chip 30 and hence the relay chip 30 can be formed by a manufacturing process of ordinary semiconductor devices, the relay chip 30 is a suitable location for formation of the ESD protection element 8.

In the voltage detection circuit having the configuration shown in FIG. 7, by virtue of the presence of the ESD protection element 8, destruction of the resistors of the first chip 10 can be prevented even if the semiconductor device receives a surge voltage at the lead terminal L10 if the second lead row.

The ESD protection element 8 can also be added to the semiconductor device according each of the third and fourth embodiments.

The invention claimed is:

1. A semiconductor device in which a first chip having a function of lowering an input voltage and a second chip having a function of performing signal processing on an output signal of the first chip are mounted on a die pad, wire connections are made between a part of chip electrodes of the first chip and the second chip and between an other part of the chip electrodes of the first chip and the second chip and external lead terminals, and a sealing resin is provided to seal,
   wherein the lead terminals constitute a first lead row and a second lead row which are opposite to each other with the die pad interposed in between, each of the first lead row and the second lead row having plural lead terminals,
   wherein the lead terminals of the first lead row are connected to a part of the chip electrodes of the first chip, an other part of the chip electrodes of the first chip are connected to a part of the chip electrodes of the second chip or a part of the lead terminals of the second lead row, and an other part of the chip electrodes of the second chip are connected to an other part of the lead terminals of the second lead row,
   wherein a distance between the lead terminals of the first lead row is set longer than a distance between the lead terminals of the second lead row to thereby allow the lead terminals of the first lead row withstand a higher applied voltage than the lead terminals of the second lead row, and
   wherein the sealing resin fills at least between the lead terminals of the first lead row.

2. A semiconductor device in which a first chip having a function of lowering an input voltage and a second chip having a function of performing signal processing on an output signal of the first chip are mounted on a die pad, wire connections are made between a part of chip electrodes of the first chip and the second chip and between an other part of the chip electrodes of the first chip and the second chip and external lead terminals, and a sealing resin is provided to seal,
   wherein the lead terminals constitute a first lead row and a second lead row which are opposite to each other with the die pad interposed in between, each of the first lead row and the second lead row having plural lead terminals,
   wherein the first chip has resistors as main constituent elements,
   wherein the second chip has an operational amplifier as a main constituent element,
   wherein the lead terminals of the first lead row are two lead terminals which are connected to two respective resistor chip electrodes formed along one side of the rectangular-shaped first chip facing the first lead row,
   wherein other resistor chip electrodes formed along an other side of the first chip opposite to the first lead row are connected to a part of operational amplifier chip electrodes formed along one side of the rectangular-shaped second chip facing the first lead row or a part of the lead terminals of the second lead row,
   wherein an other part of the operational amplifier chip electrodes of the second chip are connected to an other part of the lead terminals of the second lead row,
   wherein voltages applied to the two lead terminals of the first lead row are divided by resistors formed in the first chip, and resulting divided voltages are input to an inverting input terminal and a non-inverting input terminal of the operational amplifier formed in the second chip, and
   wherein an output signal that is produced by the second chip is externally output from one of the lead terminals of the second lead row,
   wherein the two lead terminals of the first lead row are spaced from each other by a distance adjusted to allow the two lead terminals to withstand the voltages applied thereto, and
   wherein the sealing resin fills at least between the two lead terminals of the first lead row.

3. A semiconductor device in which a first chip having a function of lowering an input voltage and a second chip having a function of performing signal processing on an output signal of the first chip are mounted on a die pad, wire connections are made between a part of chip electrodes of the first chip and the second chip and between an other part of the chip electrodes of the first chip and the second chip and external lead terminals, and a sealing resin is provided to seal, wherein the lead terminals constitute a first lead row and a second lead row which are opposite to each other with the die pad interposed in between, each of the first lead row and the second lead row having plural lead terminals, wherein the first chip has resistors as main constituent elements, the resistors including a first voltage-dividing resistor series, a second voltage-dividing resistor series and a feedback resistor, wherein the second chip has an operational amplifier as a main constituent element, wherein the lead terminals of the first lead row are two lead terminals which are connected to two respective resistor chip electrodes formed along one side of the rectangular-shaped first chip facing the first lead row, one of the two resistor chip electrodes being connected to the first voltage-dividing resistor series for dividing a voltage applied thereto, an other one of the two resistor chip electrodes being connected to the second voltage-dividing resistor series for dividing a voltage applied thereto, wherein other resistor chip electrodes formed along an other side of the first chip opposite to the first lead row are connected to a part of operational amplifier chip electrodes formed along one side of the rectangular-shaped second chip facing the first lead row or a part of the lead terminals of the second lead row, the other resistor chip electrodes including a first series connection point for outputting a first divisional voltage from the first voltage-dividing resistor series and a second series connection point for outputting a second divisional voltage from the second voltage-dividing resistor series, the first series connection point and the second series connection point being connected to an inverting input terminal and a non-inverting input terminal of the part of the operational amplifier chip electrodes, wherein the feedback resistor is connected between an output terminal of the part of the operational amplifier chip electrodes and the inverting input terminal of the part of the operational amplifier chip electrodes, wherein an other part of the operational amplifier chip electrode is connected to an other part of the lead terminals of the second lead row, wherein voltages applied to the two lead terminals of the first lead row are divided by the first voltage-dividing resistor series and the second voltage-dividing resistor series, and resulting divided voltages are input to the inverting input terminal and the non-inverting input terminal of the operational amplifier formed in the second chip, wherein an output signal that is produced by the second chip is externally output from one of the lead terminals of the second lead row, wherein the two lead terminals of the first lead row are spaced from each other by a distance adjusted to allow the two lead terminals to withstand the voltages applied thereto, and wherein the sealing resin fills at least between the two lead terminals of the first lead row.

4. The semiconductor device of claim 1,
wherein auxiliary interconnections are formed on a surface portion of the first chip at the other side thereof facing the second lead row, and
wherein the other chip electrode of the second chip is connected to the other lead terminal of the second lead row via the auxiliary interconnections.

5. The semiconductor device of claim 2,
wherein auxiliary interconnections are formed on a surface portion of the first chip at the other side thereof facing the second lead row, and
wherein an other part of the operational amplifier chip electrodes and the output terminal of the operational amplifier are connected to the lead terminals of the second lead row via the auxiliary interconnections.

6. The semiconductor device of claim 1,
wherein one lead terminal of the second lead row is connected to one chip electrode of the first chip or one chip electrode of the second chip via a relay chip that is mounted on the die pad.

7. The semiconductor device of claim 2,
wherein one lead terminal of the second lead row is connected to one resistance chip electrode of the first chip or one operational amplifier chip electrode of the second chip via a relay chip that is mounted on the die pad.

8. The semiconductor device of claim 1,
wherein suspension leads are further provided to the second lead row.

9. The semiconductor device of claim 1,
wherein the sealing resin further covers a back surface of the die pad.

10. The semiconductor device of claim 1,
wherein one lead terminal of the second lead row is connected to one chip electrode of the first chip and the second chip, one resistor chip electrode of the first chip, or one operational amplifier chip electrode of the second chip via a relay chip that is mounted on the die pad, the relay chip including an ESD protection element.

11. The semiconductor device of claim 2,
wherein the second chip further includes an additional operational amplifier in addition to the operational amplifier, and
wherein operational amplifier electrodes of the additional operational amplifier are arranged along an other side of the second chip facing the second lead row, and alongside a second-lead-row-side edge of the second chip and connected to the other part of the lead terminals of the second lead row.

\* \* \* \* \*